United States Patent
Sekine et al.

(10) Patent No.: US 9,924,592 B2
(45) Date of Patent: Mar. 20, 2018

(54) THREE-DIMENSIONAL LAMINATED CIRCUIT BOARD, ELECTRONIC DEVICE, INFORMATION PROCESSING SYSTEM, AND INFORMATION NETWORK SYSTEM

(71) Applicant: NAPRA CO., LTD., Katsushika-ku, Tokyo (JP)

(72) Inventors: Shigenobu Sekine, Tokyo (JP); Hiroaki Ikeda, Tokyo (JP)

(73) Assignee: Napra Co., Ltd., Tokyo (JP)

( * ) Notice: Subject to any disclaimer, the term of this patent is extended or adjusted under 35 U.S.C. 154(b) by 0 days.

(21) Appl. No.: 15/240,062

(22) Filed: Aug. 18, 2016

(65) Prior Publication Data
US 2018/0054887 A1 Feb. 22, 2018

(51) Int. Cl.
*H05K 1/02* (2006.01)
*H05K 1/11* (2006.01)
(Continued)

(52) U.S. Cl.
CPC ..... *H05K 1/0275* (2013.01); *H01L 23/49822* (2013.01); *H01L 23/49827* (2013.01);
(Continued)

(58) Field of Classification Search
CPC ... H05K 1/02; H05K 1/09; H05K 1/11; H05K 1/18; H05K 1/115; H05K 1/275; H05K 1/298; H05K 3/06; H05K 3/38; H05K 3/40; H05K 3/42; H05K 3/46; H01L 23/00; H01L 23/02; H01L 23/24; H01L 23/36; H01L 23/48; H01L 23/49; H01L 23/573
(Continued)

(56) References Cited

U.S. PATENT DOCUMENTS 5,361,150 A 11/1994 Kesao
5,819,406 A * 10/1998 Yoshizawa ............. H05K 3/325
156/295
(Continued)

FOREIGN PATENT DOCUMENTS

JP H04-077715 A 3/1992
JP 2004-072087 A 3/2004
(Continued)

OTHER PUBLICATIONS

Research & Development Trends of TSV Technology for 3D LSI Package (Science and Technology Trends, Apr. 2010, pp. 23-34).

*Primary Examiner* — Xiaoliang Chen
(74) *Attorney, Agent, or Firm* — Carrier Blackman & Associates, P.C.; Joseph P. Carrier; William D. Blackman

(57) ABSTRACT

Aiming at providing a three-dimensional laminated circuit board which can be confirmed, in an easy and exact manner, to be an authentic product having been manufactured and packaged honestly; and at providing an electronic device, an information processing system, and an information network system using the same, disclosed is a three-dimensional laminated circuit board that includes a substrate, interconnects, and an authentication pattern; the interconnects being provided in the thickness direction of the substrate; wherein the authentication pattern is provided on the substrate, and is characterized by material, shape, layout, structure or size discriminable from those of the interconnects and the substrate.

4 Claims, 11 Drawing Sheets

(51) Int. Cl.
*H01L 23/00* (2006.01)
*H01L 23/498* (2006.01)
*H01L 27/06* (2006.01)

(52) U.S. Cl.
CPC ...... *H01L 23/49838* (2013.01); *H01L 23/573* (2013.01); *H01L 27/0688* (2013.01); *H05K 1/0298* (2013.01); *H05K 1/115* (2013.01)

(58) Field of Classification Search
USPC .......... 174/262, 255, 257, 258, 261; 257/98, 257/687, 700, 774, 779; 361/761
See application file for complete search history.

(56) References Cited

U.S. PATENT DOCUMENTS

| | | | | |
|---|---|---|---|---|
| 6,093,476 | A * | 7/2000 | Horiuchi | H01L 21/486 174/255 |
| 6,512,186 | B1 * | 1/2003 | Nishiwaki | H05K 3/384 174/255 |
| 9,293,416 | B2 | 3/2016 | Sekine et al. | |
| 2004/0108486 | A1 * | 6/2004 | Yoshida | H01F 1/22 252/62.54 |
| 2008/0023815 | A1 * | 1/2008 | Asai | H01L 23/145 257/687 |
| 2012/0006469 | A1 * | 1/2012 | Inagaki | H01L 21/4857 156/182 |
| 2013/0168679 | A1 * | 7/2013 | Park | H01L 27/3276 257/59 |
| 2013/0176048 | A1 * | 7/2013 | Furukubo | C04B 33/00 324/756.03 |
| 2014/0138850 | A1 * | 5/2014 | Takayama | H01L 24/29 257/774 |
| 2014/0204548 | A1 * | 7/2014 | Sekine | H05K 1/162 361/761 |
| 2014/0327024 | A1 * | 11/2014 | Ishihara | H01L 24/97 257/98 |
| 2015/0097300 | A1 * | 4/2015 | Sekine | B22F 1/0003 257/779 |
| 2015/0155459 | A1 * | 6/2015 | Ishihara | H01L 25/0753 362/294 |
| 2015/0282314 | A1 * | 10/2015 | Furuta | H05K 3/4007 174/257 |
| 2015/0292682 | A1 * | 10/2015 | Yang | F21K 9/175 362/659 |

FOREIGN PATENT DOCUMENTS

| | | |
|---|---|---|
| JP | 2008-066545 A | 3/2008 |
| JP | 2009-252963 A | 10/2009 |
| JP | 2012-209311 A | 10/2012 |
| JP | 2012-212914 A | 11/2012 |
| JP | 2014-063725 A | 4/2014 |

* cited by examiner

THREE-DIMENSIONAL LAMINATED CIRCUIT BOARD, ELECTRONIC DEVICE, INFORMATION PROCESSING SYSTEM, AND INFORMATION NETWORK SYSTEM

CROSS-REFERENCE TO RELATED APPLICATIONS

This application is based on the Japanese Patent Application No. 2014-176935, filed on Sep. 1, 2014, the entire content of which is incorporated hereinto by reference.

BACKGROUND OF THE INVENTION

1. Field of the Invention

This invention relates to a three-dimensional laminated circuit board, an electronic device, an information processing system, and an information network system.

2. Description of the Related Art

As a technique of implementing three-dimensional circuit arrangement of integrated circuits based on a variety of scales, or electronic elements including various types of semiconductor devices or chips thereof, there has been proposed a three-dimensional laminated circuit board that is composed of a plurality of circuit boards stacked therein, wherein each board having a number of through-electrodes formed therein based on the TSV (Through-Silicon-Via) technology. Such three-dimensional laminated circuit board using the TSV technology has been described, for example, in "Research & Development Trends of TSV Technology for 3-Dimensional LSI Package" (in Japanese), Science & Technology Trends, April 2010.

By the way, recent globalization of technology has created a situation in which not all manufacturing processes of three-dimensional laminated circuit board are trustworthy. In the manufacturing processes, there is now a risk of incorporation of a malicious circuit called "Trojan horse" or "backdoor". "Trojan horse" is malware which could be incorporated in the form of a malicious circuit, typically by tampering hardware in a semiconductor chip, for the purpose of inducing malfunction of system, or stealing information. "Backdoor" is a function secretly provided in a computer, plotting unauthorized use of computer functions.

In order to avoid the risk of incorporation of the malicious circuit or function such as "Trojan horse" or "backdoor", each of the circuit boards should be externally confirmable that it has been manufactured and packaged honestly.

A confirmation means having widely been used is physical unclonable function (PUF) that incorporates unclonable ID information into a device of each layer composing the three-dimensional laminated structure.

However, the PUF technology, intended to be applied to the three-dimensional laminated structure, will inevitably encounter difficulties including design restrictions such that it requires additional external connection for an information reading system.

SUMMARY OF THE INVENTION

It is therefore an object of this invention to provide an advanced technology which is extremely useful for constructing an electronic circuit system having functions for preventing, for example, malfunction of LSI chips and so forth, and information leakage therefrom.

More specifically, it is an object of this invention to provide a three-dimensional laminated circuit board which contributes to implement an electronic device structure having functions of preventing, for example, malfunction and information leakage, and to provide an electronic device, an information processing system, and an information network system using the same.

It is another object of this invention to provide a three-dimensional laminated circuit board, an electronic device, an information processing system, and an information network system which can easily and exactly be confirmed that they are authentic products manufactured and packaged honestly.

It is still another object of this invention to provide a three-dimensional laminated circuit board, an electronic device, an information processing system, and an information network system which can easily and exactly be confirmed that they are not authentic products manufactured and packaged honestly, but cloned products.

Aimed at solving the problems described above, a three-dimensional laminated circuit board of this invention includes a substrate, an interconnect, and an authentication pattern. The interconnect is provided to the substrate so as to be electrically insulated therefrom. The authentication pattern is provided on the substrate, and is characterized by material, shape, layout, structure or size discriminable from those of the interconnect and the substrate.

Since, as described above, the three-dimensional laminated circuit board of this invention includes a substrate and an interconnect, and since the interconnect is provided to the substrate so as to be electrically insulated therefrom, so that the board applied with the TSV technology can contribute to implement the three-dimensional laminated structure.

The three-dimensional laminated circuit board of this invention includes an authentication pattern. The authentication pattern is provided on the substrate, and is characterized by material, shape, layout, structure or size discriminable from those of the interconnect and the substrate. Such authentication pattern may be confirmed by external observation as a pattern discriminable from the substrate, the interconnect, and an insulation part. In this way, the three-dimensional laminated circuit board may be confirmed, in an easy and exact manner by external observation, to be a product having been manufactured and packaged honestly, that is, an authentic three-dimensional laminated circuit board.

This conversely means that some board can be confirmed, in an easy and exact manner, to be a non-authentic product, or cloned product, not having been manufactured and packaged honestly. The authentication pattern may be confirmed typically by using an X-ray CT apparatus, even when it is contained in the three-dimensional laminated circuit board configured by laminating a plurality of interconnect substrates.

The three-dimensional laminated circuit board of this invention, depending on its form, may be used as it is as an electronic device, or, may be incorporated into various types of electronic devices. These electronic devices are used as components of information processing systems or information network systems.

Summarizing the above, this invention can provide an advanced technology which is extremely useful for constructing an electronic circuit system having functions for preventing, for example, malfunction of LSI chips and so forth, and information leakage therefrom.

BRIEF DESCRIPTION OF THE DRAWINGS

The above and other objects, configurations and advantages of this invention will further be detailed referring to the attached drawings which are presented merely for exemplary purposes.

DESCRIPTION OF THE PREFERRED EMBODIMENTS

1. Interconnect Substrate

Each of FIG. 1 to FIG. 4 illustrates a part of an interconnect substrate used for the three-dimensional laminated circuit board of this invention. The illustrated interconnect substrate includes a substrate 1, interconnect patterns P11 to Pnm each individually containing interconnects 311 to 326, and an authentication pattern Q.

Figure 1:
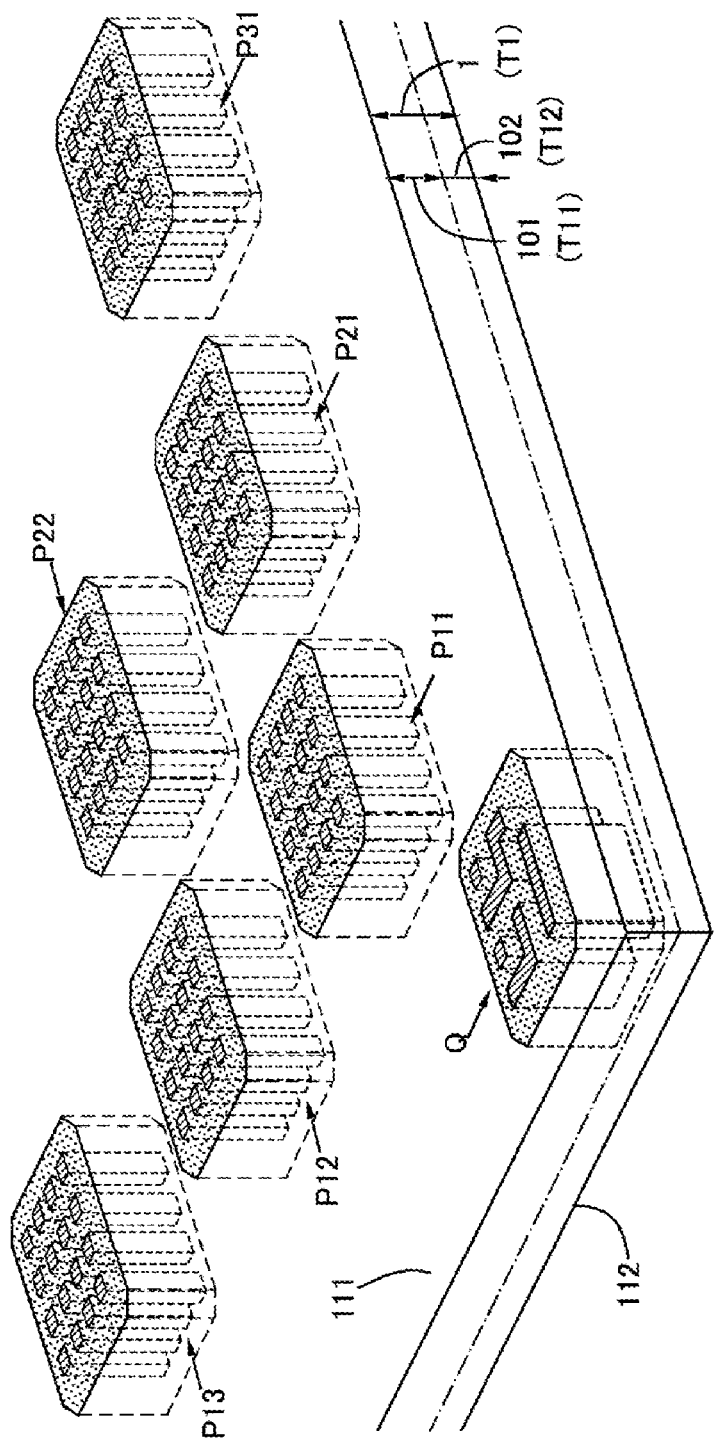
FIG. 1 is a perspective view illustrating a part of an interconnect substrate used for the three-dimensional laminated circuit board of this invention.
Figure 2:
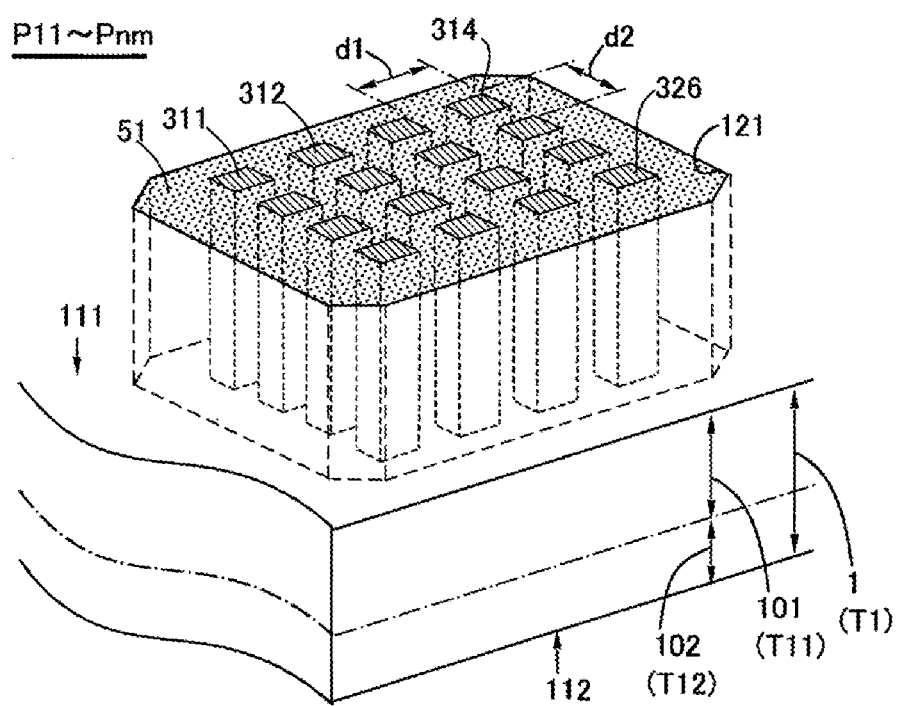
FIG. 2 is an enlarged perspective view illustrating an exemplary interconnect used for the three-dimensional laminated circuit board of this invention.
Figure 3:
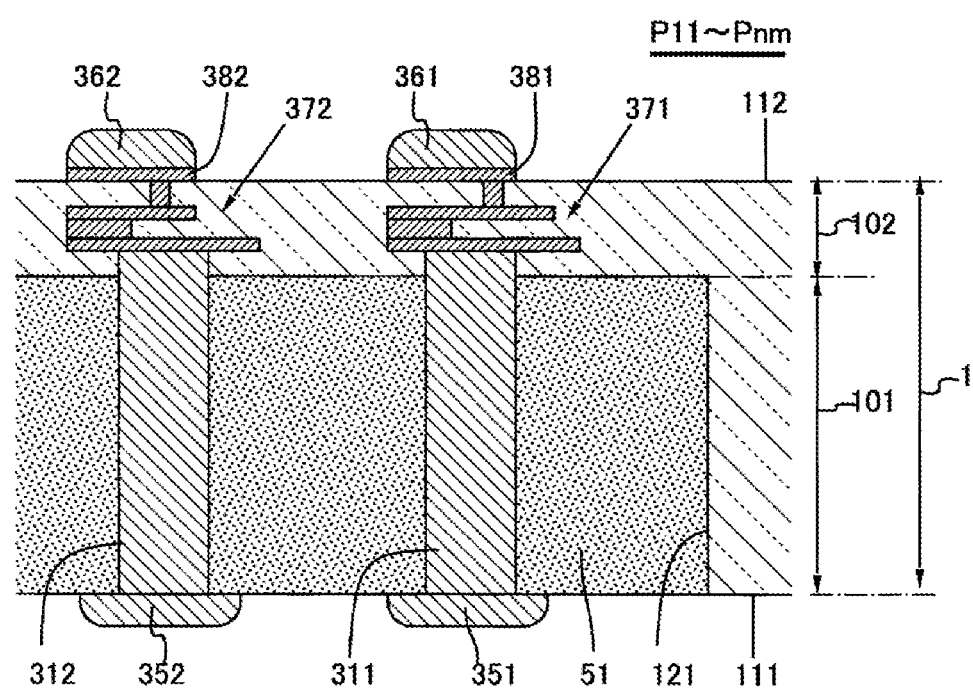
FIG. 3 is an enlarged cross-sectional view illustrating an exemplary interconnect used for the three-dimensional laminated circuit board of this invention.

The substrate 1 is a semiconductor substrate typically composed of a Si substrate or SiC substrate, typically having a thickness T1 of 50 μm or smaller, and is composed of a substrate layer 101 having thickness T11, and a semiconductor forming layer 102 having thickness T12. As illustrated in FIG. 3, the semiconductor forming layer 102 internally has semiconductor circuit parts 371, 372. At least portions of the semiconductor circuit parts 371, 372 are respectively connected to electrodes 381, 382 provided to the other face 112 opposite to one face 111 of the substrate 1. The electrodes 381, 382 may optionally have bumps 361, 362 formed thereon.

Each of the interconnect patterns P11 to Pnm has an insulation part 51, and a plurality (n=16) of interconnects 311 to 326 arranged in the plane of the insulation part 51 at narrow pitches of d1 and d2. Numeral n takes an arbitrary number.

The insulation part 51 is filled in each of micro-spaces 121 formed over the one face 111 of the substrate 1. The insulation part 51 is preferably formed by filling an insulating paste which contains an insulation particle, Si particle, and a liquid organosilicon compound, into grooves or holes (occasionally referred to as micro-spaces) 121 formed thickness-wise in the substrate 1, followed by curing. When the insulating paste is filled in the micro-spaces 121 and annealed, the Si particle and the organosilicon compound react to form Si—O bonds, and thereby obtained is an insulation structure in which the insulation particle, which serves as an aggregate, is surrounded by the Si—O bonds. Each of the insulation particle and the Si particle has a particle size of nanometer range (submicron range). The insulation particle and the Si particle are not necessarily uniform in size, and may have different particle sizes within the nanometer range.

The interconnects 311 to 326 extend in the direction of thickness T1 of the substrate 1, expose one ends thereof to the surface of the insulation 51 on the one face 111 side of the substrate 1, and have bumps 351, 352 joined to such exposed end faces. The interconnects 311 to 326 may be through-conductors having the other ends exposed to the bottom face 112 of the substrate 1, or may be non-through-conductors having the other ends buried in the substrate 1. Although not shown in the drawings, lateral interconnects may sometimes be provided on the surface of, or inside the substrate 1.

The interconnects 311 to 326, shown in this embodiment to be quadrilateral in a planar view, may have other polygonal or circular shape. The layout, shown herein to be a 4×4 matrix, may have arbitrary numbers of row and column. The interconnects 311 to 326 may be formed by any of known techniques including plating, molten metal filling, and conductive paste filling. As for typical dimensions of the interconnect 311 to 326, the arrangement pitches d1, d2 fall in the range from 4 to 100 μm, and the diameter falls in the range from 0.5 to 25 μm. Note that the arrangement pitches are not necessarily constant, and the diameter is not limited to the above-described value.

In the illustrated interconnect substrate, the insulation part 51 is composed of an insulating material filled in the micro-spaces 121 such as grooves or holes formed in the thickness direction of the substrate 1, so that the insulation part 51 is integrated with the substrate 1 composed of a Si substrate or the like.

The plurality of interconnect 311 to 326 are arranged at narrow pitches d1, d2, in the plane of the insulation part 51 integrated with the semiconductor substrate typically composed of a Si substrate, and, the insulation part 51 is filled in the micro-spaces such as grooves or holes which extend in the thickness direction. The individuals of the plurality of interconnects 311 to 326 are therefore supported by a common single insulation part 51, electrically isolated from each other, and also electrically isolated from the substrate 1. Such electrical insulation structure contributes to greatly reduce the pitches d1, d2 between the adjacent three-dimensional interconnects typically down to 4 μm or narrower, as compared with the case where each of the plurality of interconnects 311 to 326 is electrically isolated and then arranged on the substrate 1. In this way, there may be created a three-dimensional interconnect substrate characterized by a narrow-pitch TSV layout and insulation structure.

The interconnects 311 to 326 may contain at least one species selected from the group consisting of Ag, Cu, Au, Pt, Ti, Zn, Al, Fe, B, Si and Ni; and at least one species selected from the group consisting of Sn, In, Bi and Ga. The former group includes refractory metals, and the latter group includes low melting point metals.

The quantity, shape, layout and so forth of the interconnects 311 to 326 are engineering expedient selectable from various viewpoints including rational routing of signal transmission path, and fulfillment of electrical characteristics required for the signal transmission path.

The authentication pattern Q, provided on the substrate 1, is characterized by material, shape, arrangement, structure or size discriminable from those of the interconnects 311 to 326, the insulation parts 51, 52 and the substrate 1. The authentication pattern Q in this embodiment is composed of a metal or alloy material, which is different from the material composing the substrate 1. More specifically, the material same as the interconnects 311 to 326 may be used. Having said that, the authentication pattern Q only needs be discriminable from the interconnects 311 to 326 and the substrate 1, and is therefore not necessarily composed of metal or alloy. It may be composed of a ceramic material, a composite material obtained by mixing a ceramic material and an organic material, or, a composite material composed of any of these materials and a metal or alloy material.

The authentication pattern Q in this embodiment is formed in an insulation part 52 filled in the micro-space 122 provided on one face of the substrate 1. The insulation part 52 may be configured by using a material same as, or different from, the material composing the insulation part 51 of the interconnect patterns P11 to Pnm.

The authentication pattern Q is configured by forming first pattern element 331 to fifth pattern element 335 in the insulation part 52. The first pattern element 331 to the fifth pattern element 335 have shapes, layout, structures and dimensions different from those of the interconnects 311 to 326. All of the interconnects 311 to 326 have an almost equal quadrilateral shape in a planar view, whereas in the authentication pattern Q, the first pattern element 331 has an L-shape in a plan view, the second pattern element 332 has a quadrilateral shape in a plan view, the third pattern element 333 has a crank form in a plan view, the fourth pattern element 334 has a quadrilateral shape in a plan view, and the fifth pattern element 335 has a rectangular form in a plan view. The arrangement pitches of the first pattern element 331 to the fifth pattern element 335 are preferably several micrometers or narrower for example.

The shape, layout, structure, size and so forth of the first pattern element 331 to the fifth pattern element 335 may be set or modified at one's will, so long as they are discriminable from the interconnects 311 to 326. For example, they may have any of shapes, layouts and structures including crank, cross, letter T, kinked line, and combinations thereof.

Figure 4:
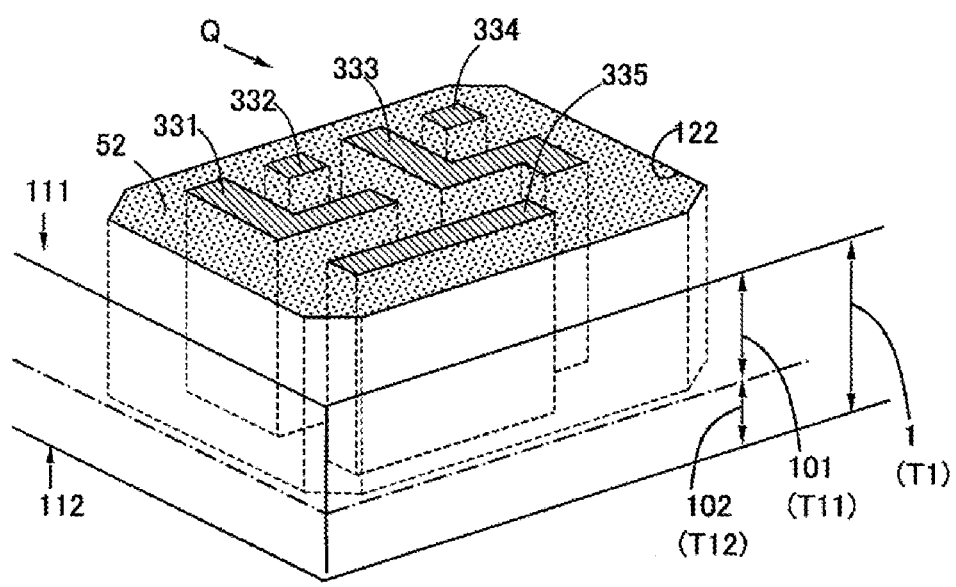
FIG. 4 is an enlarged perspective view illustrating an exemplary authentication pattern used for the three-dimensional laminated circuit board of this invention.
Figure 5:
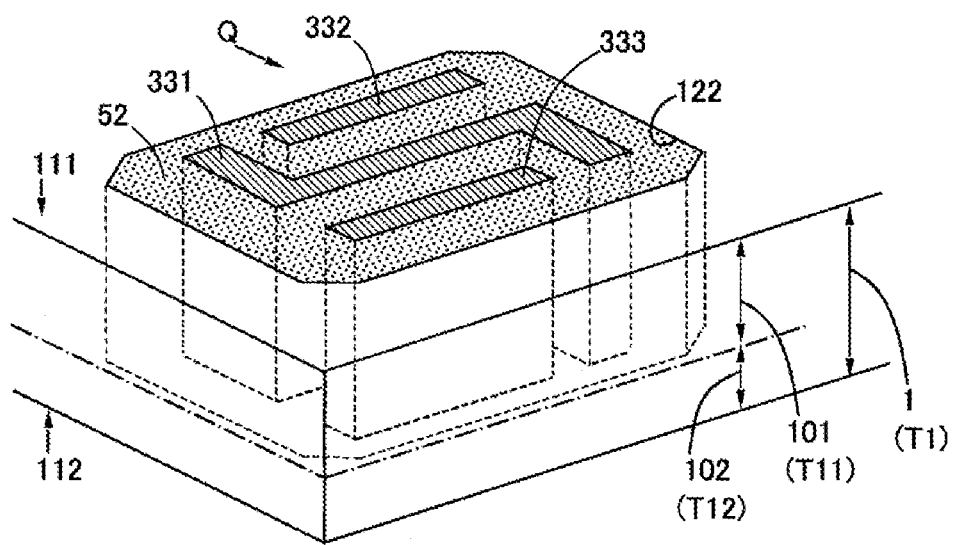
FIG. 5 is a perspective view illustrating another embodiment of the authentication pattern used for the three-dimensional laminated circuit board of this invention.

To take a single instance, FIG. 5 illustrates an authentication pattern Q composed of three (first to third) pattern elements 331 to 333 having longer planar shapes as compared with those in FIG. 4.

Figure 6:
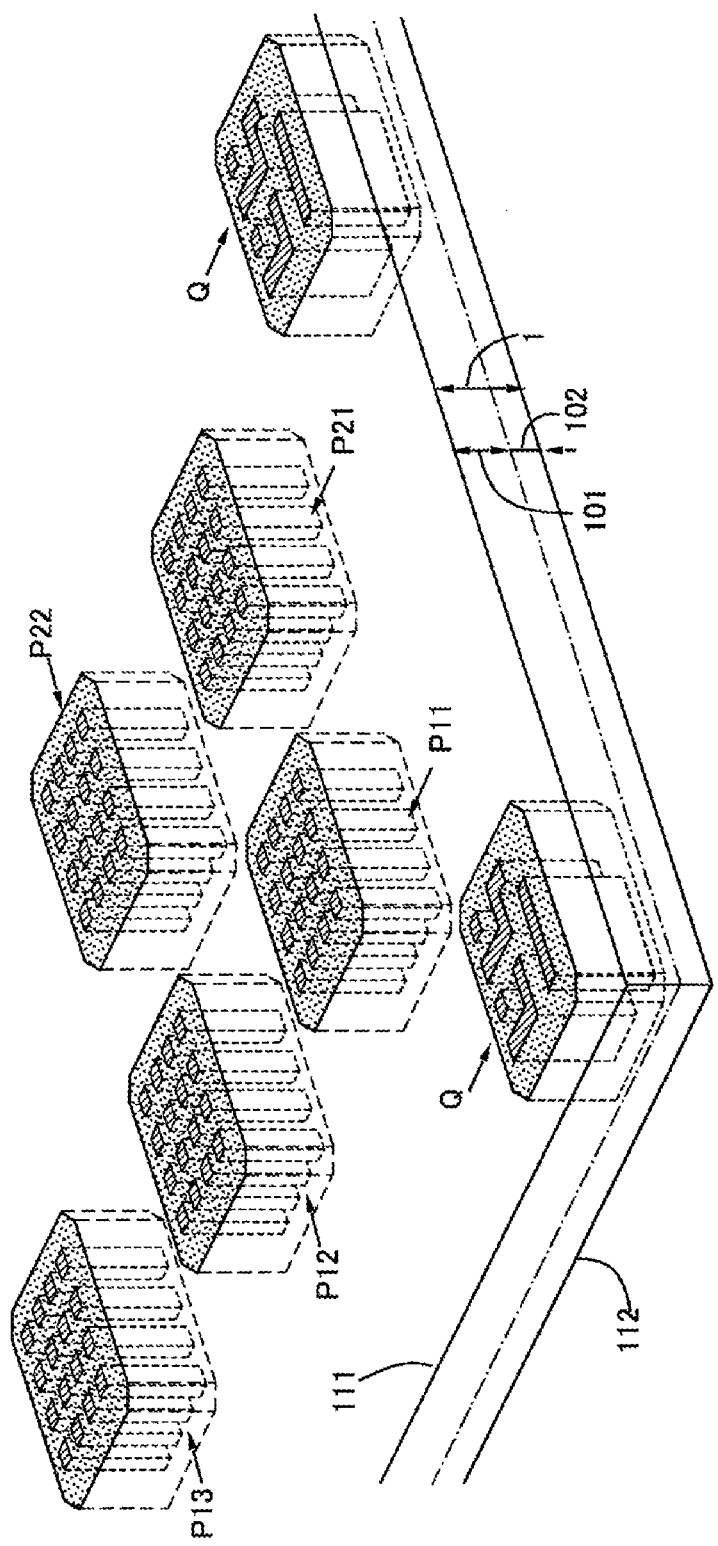
FIG. 6 is a perspective view illustrating a part of another embodiment of the interconnect substrate used for the three-dimensional laminated circuit board of this invention.

A plurality of authentication patterns Q may be provided on a single interconnect substrate. For example, as illustrated in FIG. 6, a plurality of authentication patterns Q may be arranged keeping a proper space in between.

As described above, the authentication pattern Q is provided on the substrate 1, and is characterized by material, shape, layout, structure or size discriminable from those of the interconnects 311 to 326 and the substrate 1. Such authentication pattern Q may be confirmed by external observation, as a pattern discriminable from the substrate 1 and the interconnects 311 to 326.

Figure 7:
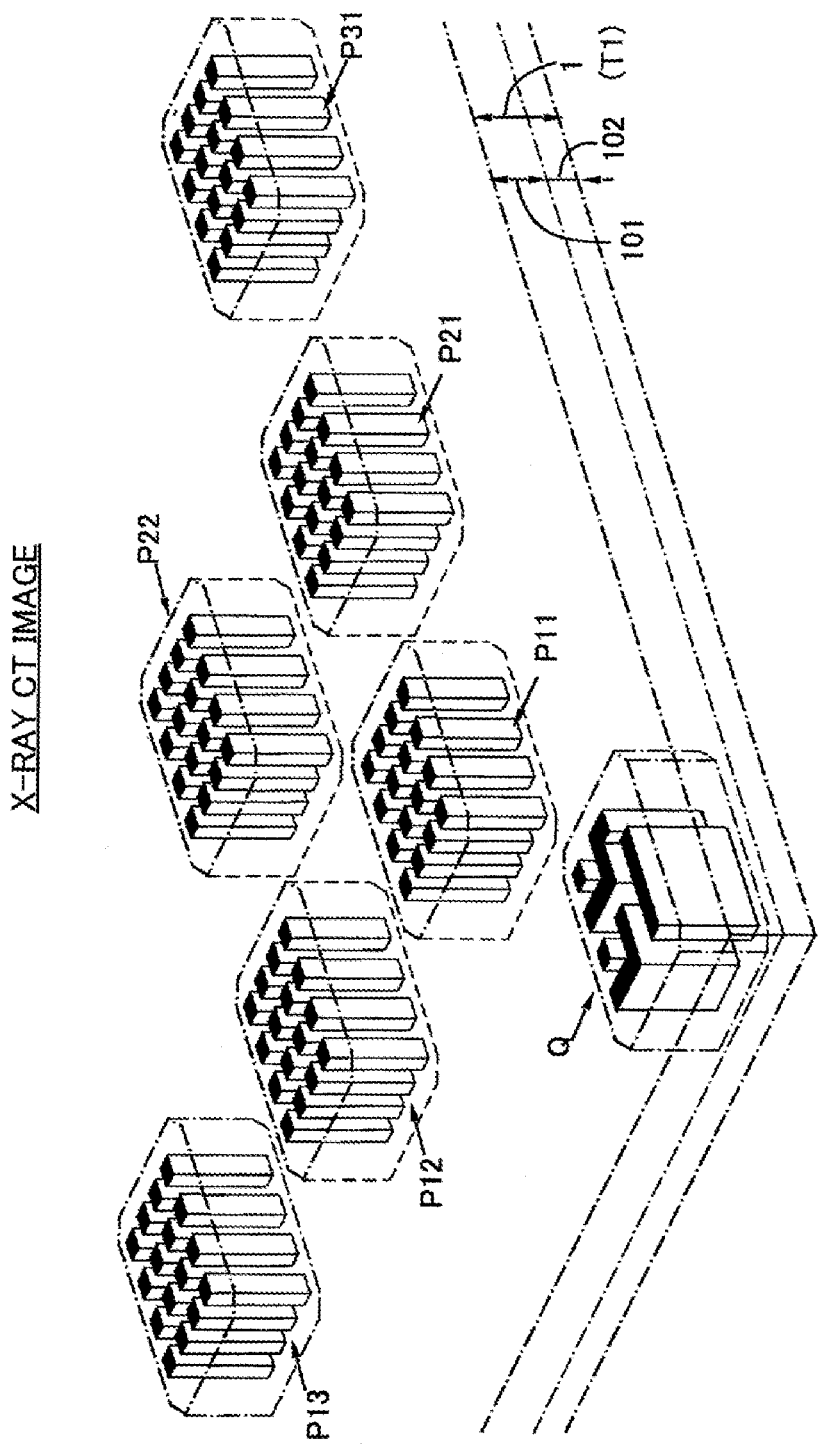
FIG. 7 is a perspective view for explaining confirmation of the authentication pattern on the interconnect substrate illustrated in FIG. 1 to FIG. 6, using an X-ray CT apparatus.

The external observation may be implemented typically by using an X-ray CT apparatus. FIG. 7 illustrates an X-ray CT image assumed when the first pattern element 331 to the fifth pattern element 335, composing the authentication pattern Q, are formed by using a metal or alloy material same as that composing the interconnects 311 to 326. In this way, the interconnect substrate may be confirmed, in an easy and exact manner, to be an authentic product having been manufactured and packaged honestly, by externally observing the authentication pattern Q. This conversely means that any false interconnect substrate may be confirmed, in an easy and exact manner, to be a non-authentic product, or cloned product, not having been manufactured and packaged honestly.

2. Three-Dimensional Laminated Circuit Board and Electronic Device

The three-dimensional laminated circuit board of this invention is configured by laminating a necessary number of the above-descried interconnect substrates. The three-dimensional laminated circuit board may be used as a constituent of an electronic device. Such electronic device may typically include system LSI in the form of three-dimensional system packages (3D-SiP), memory LSI, memory circuits such as DRAM, logic circuits such as CPU, communication circuit and MEMS. Also electronic elements having not only a digital circuit but also an analog circuit may be used. The electronic device of this invention include almost all categories of electronic devices and electronic elements incorporating an electronic circuit as a functional element, including electronic devices containing the above-described electronic elements, such as MPU, personal computer, supercomputer, mobile phone and in-vehicle equipment.

Figure 8:
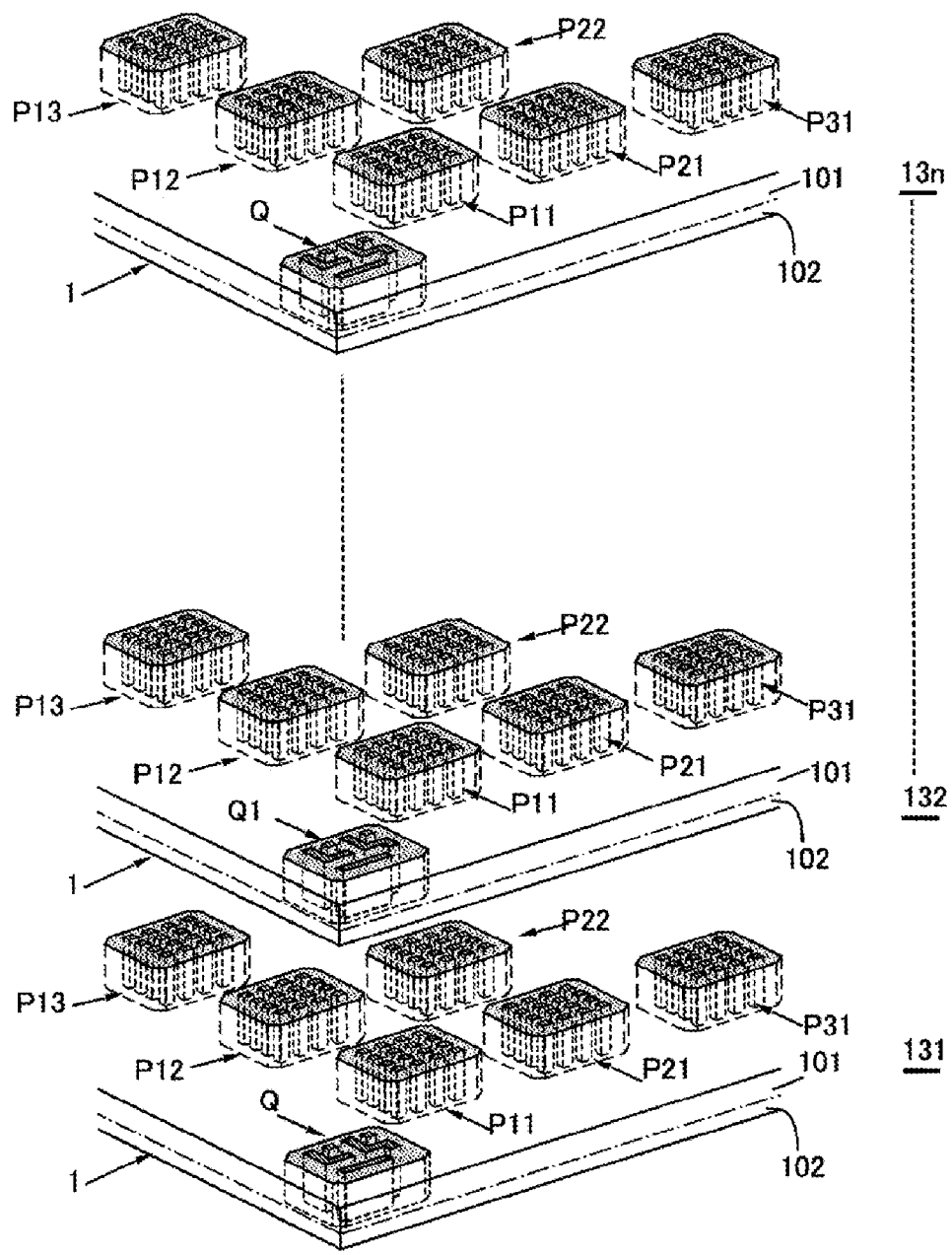
FIG. 8 is a perspective view illustrating the three-dimensional laminated circuit board of this invention.

FIG. 8 illustrates an exemplary three-dimensional laminated circuit board in the form of 3D-SiP, which is a package having a plurality of (n) interconnect substrates 131 to 13n shown in any one of FIG. 1 to FIG. 7 successively stacked therein.

Figure 9:
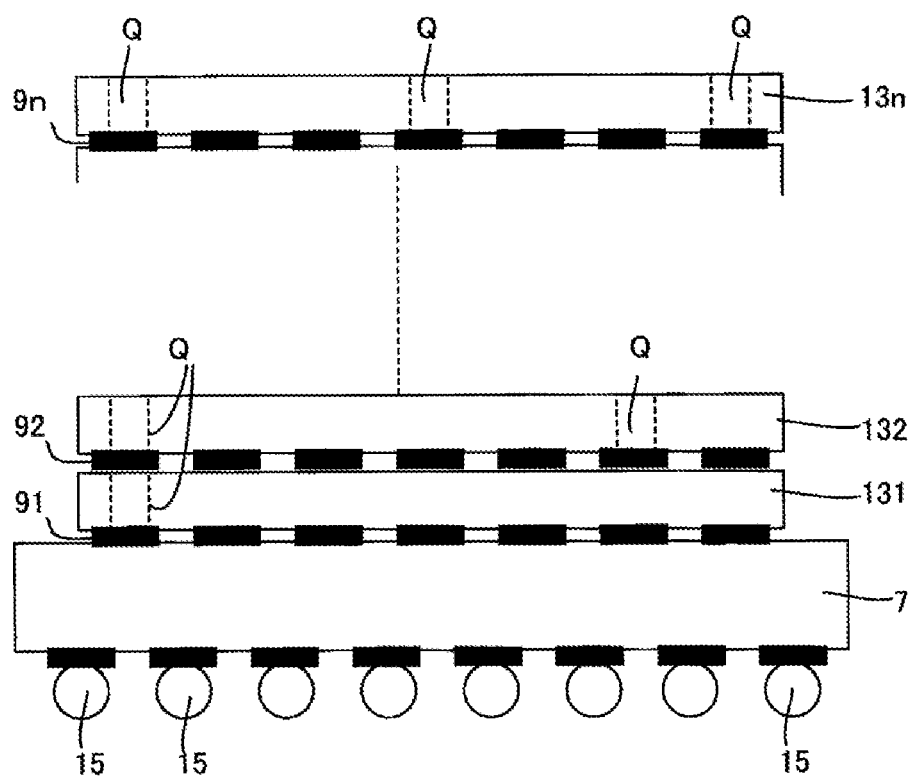
FIG. 9 is a front elevation of the three-dimensional laminated circuit board illustrated in FIG. 8, or an electronic device.
Figure 10:
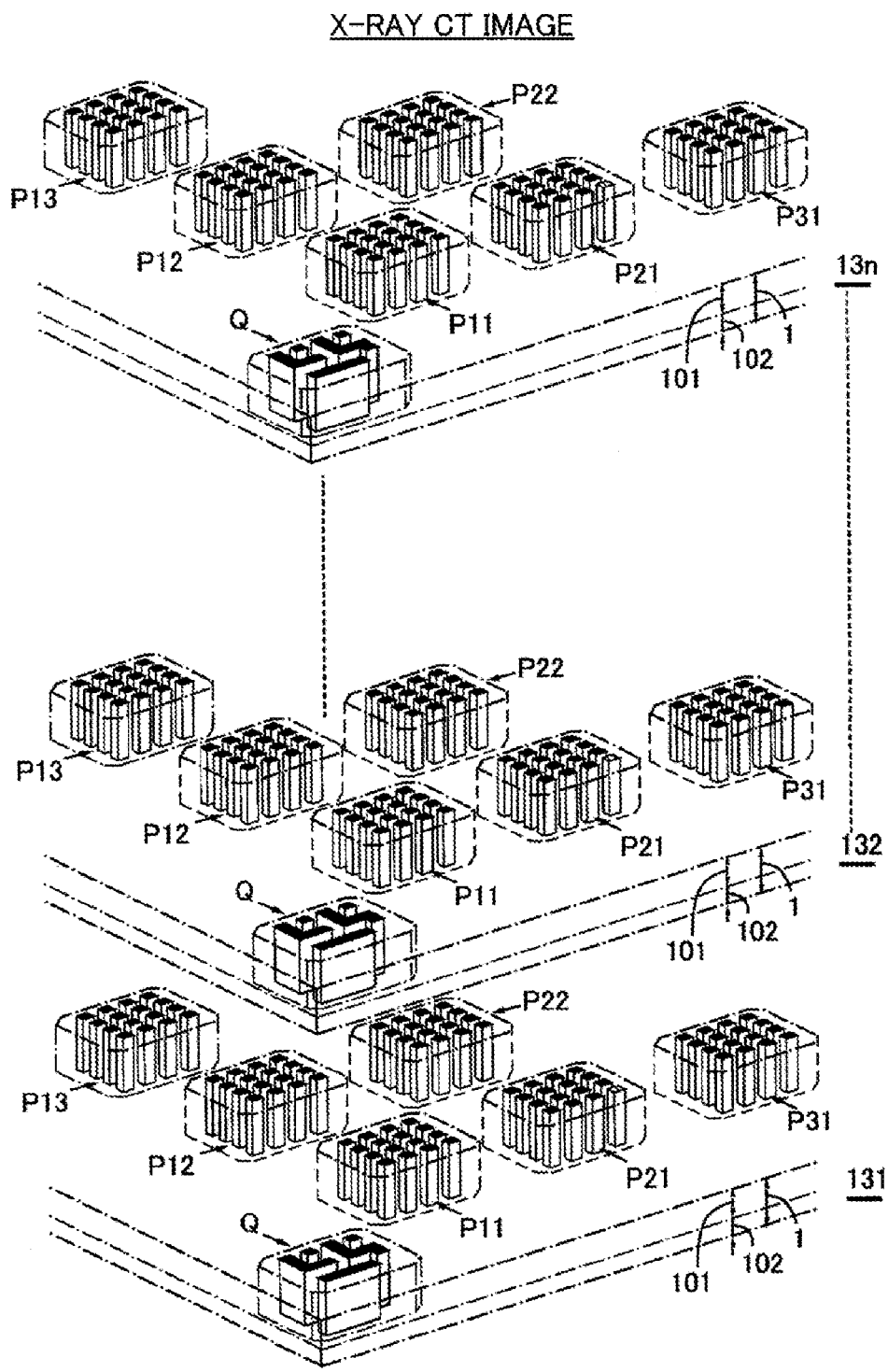
FIG. 10 is a perspective view for explaining confirmation of the authentication pattern on the three-dimensional laminated circuit board illustrated in FIG. 8 and FIG. 9, using an X-ray CT apparatus.

A final form of assembly may be a structure illustrated in FIG. 9, in which the interconnect substrates 131 to 13n are successively disposed as illustrated in FIG. 8, on a package substrate 7 having a ball grid array 15 on the back surface thereof, and are joined through connection parts 91 to 9n. Even in the form of such package, presence or absence of the authentication pattern Q may be confirmed typically by using an X-ray CT apparatus, as illustrated in FIG. 10.

3. Information Processing System and Information Network System

Figure 11:
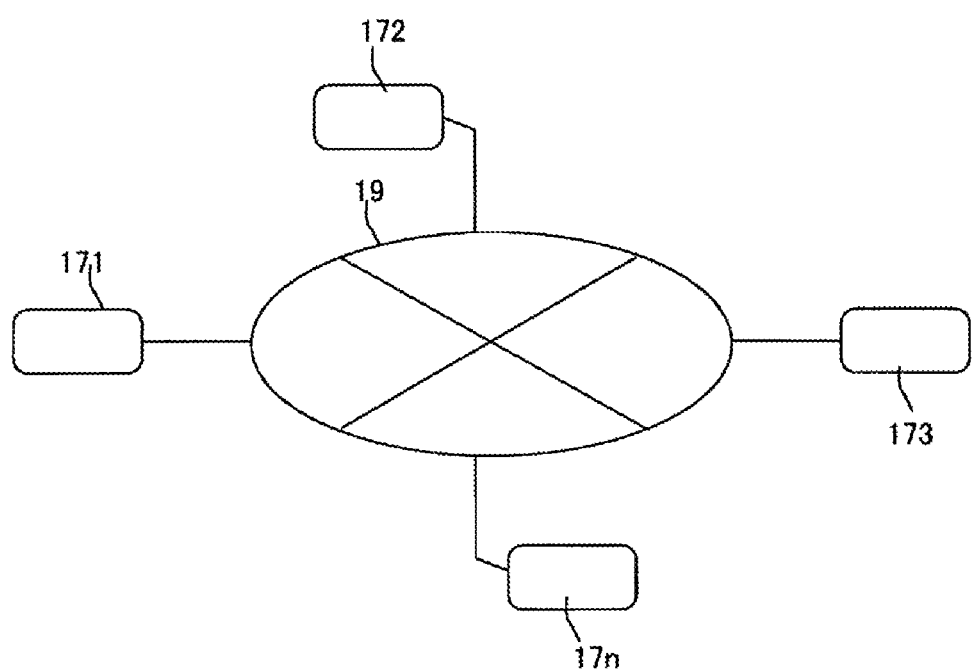
FIG. 11 is a diagram illustrating an information processing system and an information network system of this invention.

FIG. 11 illustrates an information processing system and an information network system of this invention. The information processing system refers to an aggregate of computers and program products, which is configured to integrally perform tasks of information processing. The information network system refers to a system that contains communication equipment and a network together with the information processing system, and is configured to send and receive information. The illustrated information processing system is composed of a plurality of (n) terminal devices 171 to 17n, and the information network system is configured to contain a network 19, together with the above-described terminal devices 171 to 17n.

Each of the terminal devices 171 to 17n contains personal computer, mobile phone, tablet and so forth, and also a variety of sensors. The network 19 may contain not only the Internet, but also LAN (Local Area Network) represented by in-vehicle local area network. The network 19 may alternatively be a personal area network to which printer, facsimile, telephone, scanner and so forth are connected.

Since the information processing system and information network system of this invention is configured to contain the three-dimensional interconnect substrate and the electronic device having been confirmed that they were manufactured and packaged honestly, so that it is now possible to avoid a risk of incorporation of malicious circuit or function called "Trojan horse" or "backdoor", and to impart them with advanced safety.

This invention has been detailed above referring to some preferred embodiments by which this invention by no means limited. It is apparent that those skilled in the art can contemplate a variety of modifications based on the basic technical spirit and teaching of this invention.

As has been described above, the following effects may be obtained by this invention.

(a) The invention can provide a three-dimensional laminated circuit board which contributes to implement a three-dimensional laminated structure; and can also provide an electronic device, an information processing system, and, information network system using the same.

(b) The invention can provide an advanced technology which is extremely useful for constructing an electronic circuit system having functions for preventing, for example, malfunction of LSI chips and so forth, and information leakage therefrom.

(c) The invention can provide a three-dimensional laminated circuit board which contributes to implement an electronic device structure having functions for preventing, for example, malfunction and information leakage; and can also provide an electronic device, an information processing system, and an information network system using the same.

(d) The invention can provide a three-dimensional laminated circuit board which can be confirmed, in an easy and exact manner, to be an authentic product having been manufactured and packaged honestly; and can provide an electronic device, an information processing system, and an information network system using the same.

(e) The invention can provide a three-dimensional laminated circuit board which can be confirmed, in an easy and exact manner, to be a non-authentic product, or cloned product, not having been manufactured and packaged honestly; and can also provide an electronic device, an information processing system, and an information network system using the same.

What is claimed is:

1. A three-dimensional laminated circuit board comprising
   a substrate,
   an interconnect, and
   an authentication pattern,
   the interconnect being provided to the substrate so as to be electrically insulated therefrom,
   the authentication pattern being provided on the substrate, and being characterized by material, shape, layout, structure or size which are discriminable from those of the interconnect and the substrate by external observation,
   the interconnect comprising a conductor that is supported by an electric insulation part and extends in the thickness direction of the substrate, and
   the electric insulation part of the authentication pattern being configured by using an insulation particle as an aggregate that is surrounded by Si—O bonds resulted from a reaction between an Si particle and an organosilicon compound.

2. An electronic device comprising a three-dimensional laminated circuit board, the three-dimensional laminated circuit board comprising the three-dimensional laminated circuit board described in claim 1.

3. An information processing system comprising an electronic device, the electronic device comprising the electronic device described in claim 2.

4. An information network system comprising an electronic device, the electronic device comprising the electronic device described in claim 2.

* * * * *